United States Patent [19]
MacPherson et al.

[11] Patent Number: 5,929,627
[45] Date of Patent: Jul. 27, 1999

[54] SURFACE MOUNT POLARIZED ELECTRICAL COMPONENTS ON A PRINTED CIRCUIT BOARD AND METHOD THEREOF

[75] Inventors: Robert Alexander MacPherson, West Kilbride; John James McMorran, Largs, both of United Kingdom; Daniel Tolan, Austin, Tex.; Alan Wyllie, Fairlie Largs, United Kingdom

[73] Assignee: International Business Machines Corporation, Armonk, N.Y.

[21] Appl. No.: 08/739,768

[22] Filed: Oct. 30, 1996

[30] Foreign Application Priority Data

Feb. 11, 1995 [GB] United Kingdom .................. 9522459

[51] Int. Cl.$^6$ .................................................. G08B 21/00
[52] U.S. Cl. ........................................ 324/158.1; 340/540
[58] Field of Search ....................... 324/158.1, 768–769; 340/686, 540, 635, 653

[56] References Cited

U.S. PATENT DOCUMENTS

| | | | |
|---|---|---|---|
| 4,539,623 | 9/1985 | Irikura et al. ............................ | 361/540 |
| 4,675,790 | 6/1987 | DeMatos et al. ........................ | 361/540 |
| 4,933,812 | 6/1990 | Becker .................................... | 361/540 |
| 5,010,447 | 4/1991 | Wallace ................................... | 361/400 |

OTHER PUBLICATIONS

IBM Technical Disclosure Bulletin, vol. 31, No. 3, Aug. 1988, pp. 367–368, "Two–Pad Surface–Mounted Tantalum Chip Capacitor with Diagonally Opposed Contacts".

IBM Technical Disclosure Bulletin, vol. 28, No. 3, Aug. 1985, pp. 940–941, "Polarized Capacitor Mounting".

*Primary Examiner*—Josie Ballato
*Assistant Examiner*—Russell M. Kobert
*Attorney, Agent, or Firm*—Aziz M. Ahsan

[57] ABSTRACT

The present invention relates generally to a new arrangement for surface mounting a polarized electrical component (e.g. tantalum capacitor) on a printed circuit board. Also described is that the electronic device is testable electrically to indicate both the proper mechanical mounting and the correct orientation of the electronic component on the printed circuit card. The arrangement comprises an electrical component having a first and second power connector leads and further having a test connector lead. The arrangement further includes a circuit board having a connector footprint having a first and second pads connected to supply rails on the printed circuit board and also a pair of test pads connected to first and second test points on the circuit card. Correct orientation of the component is indicated when the test lead is connected to a first of the test pads and one of the first or second power leads bridges between the second test pad and one of the pair of pads connected to the supply rails. And improper connection and orientation of the component is indicated when said one of said first or second power leads bridges between the first of the test pads and the other of the pair of pads connected to the supply rails.

10 Claims, 2 Drawing Sheets

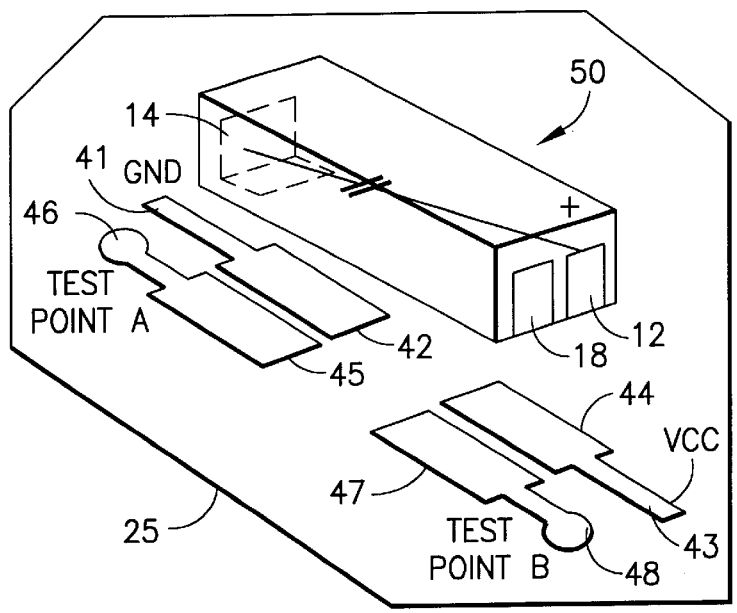
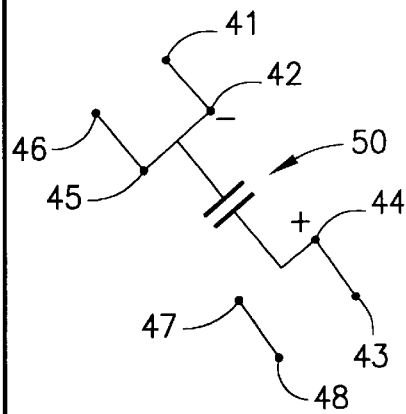
FIG.3A    FIG.3B
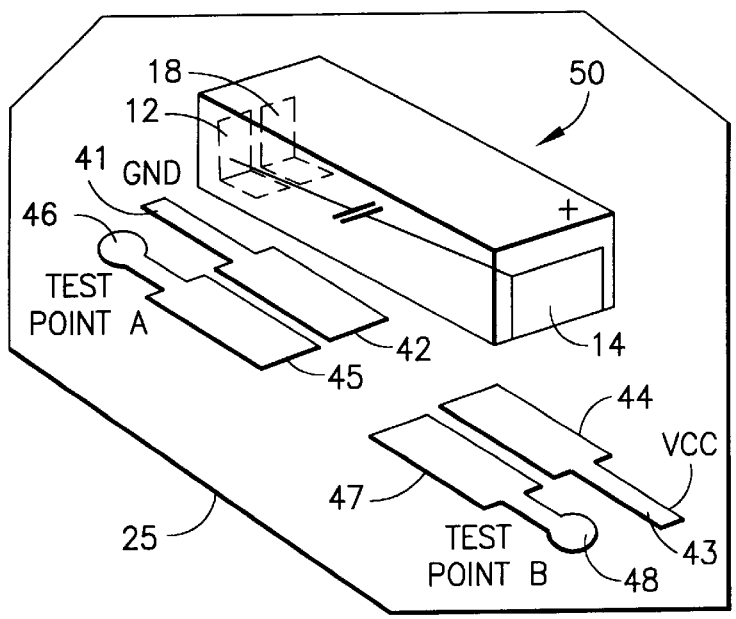
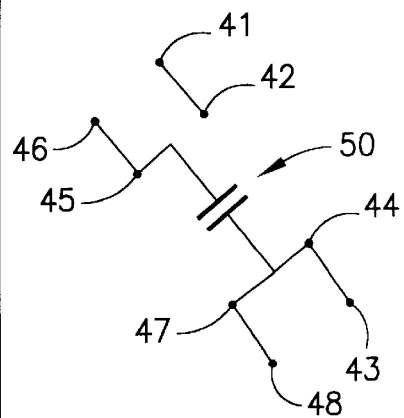
FIG.4A    FIG.4B

SURFACE MOUNT POLARIZED ELECTRICAL COMPONENTS ON A PRINTED CIRCUIT BOARD AND METHOD THEREOF

FIELD OF THE INVENTION

The present invention relates generally to a new method for surface mounting electrical components, such as, for example, a polarized capacitors, on a circuit board. An arrangement for testing the proper mechanical connection and orientation of such mounted electronic components is also disclosed.

BACKGROUND OF THE INVENTION

Semiconductor devices are becoming smaller and more dense with the evolution of new technology. However, increases in circuit density produce a corresponding increase in overall requirements for semiconductor devices. Manufacturers of semiconductor devices in order to remain competitive are therefore constantly challenged to improve their products. This is done in a number of different ways, such as, for example, by identifying and eliminating defects or to produce features that give the manufacturer a competitive advantage.

Whereas significant improvements have been made to eliminate systematic defects by reducing process variability. Process improvements alone are not sufficient, and therefore new techniques have to be employed to improve the products.

Furthermore, in printed circuit board manufacturing, the testing of the accurate connection of electrical and electronic components on the printed circuit board is an important part of the process if high quality products are to be produced. With certain types of components, the correct placement and connection is critical in order to avoid damage to the circuit. For example, the improper installation of surface mounted polarized capacitors, e.g. electrolytic or tantalum capacitors, on electronic circuit board or board assemblies poses a potential safety hazard, such as, for example, explosion or fire.

For such electronic components, such as, capacitors, it is therefore crucial to ensure not only that good electrical connection is achieved, but also that the electronic component or capacitor is correctly oriented (i.e., correctly polarized) with respect to the connector pads on the circuit board.

Reversing the electronic component or capacitor on a circuit board can happen even on an automated line where capacitors come out of pre-packed tape reels. If a severed tape reel needs to be reconnected, there is always the possibility of incorrect loading.

Visual inspection for the correct polarization of such capacitors is time consuming and costly and may even be impracticable in cases where the capacitor is positioned underneath another component.

An alternative to visual inspection involves the vibration or shaking of the assembly to verify that no capacitor is loose. However, this technique does not indicate whether the orientation of the capacitor is correct.

Other more sophisticated testing techniques have been developed for detecting reversed polarized capacitors, but these techniques require the use of complex and expensive test apparatus.

Other known techniques for ensuring correct placement and orientation of electronic components have been disclosed, such as, for example, in IBM Technical Disclosure Bulletin, entitled "Polarized Capacitor Mounting", Vol. 28, No. 3, pp 940–41 (August 1985), or in IBM Technical Disclosure Bulletin, entitled "Two-Pad Surface-Mounted Tantalum Chip Capacitor With Diagonally Opposed Contacts", Vol. 31, No. 3, pp 367–368 (August 1988). These additional techniques are not necessarily suitable for surface mount capacitors.

While the above referenced techniques may achieve the required result, some do not address the additional problem arising when repairs are carried out to a circuit board after the manufacturing and testing process. When polarized capacitors are replaced during a repair, it is fairly uncommon for additional testing to be carried out on the new capacitor. The aforementioned safety hazard will then be present in the repaired circuit board if the capacitor is reversed.

U.S. Pat. No. 5,010,447 (Wallace), discloses a method for testing for the proper electrical and mechanical connection of a capacitor to a printed circuit board by placing the capacitor terminal in series with a power lead for a memory device by splitting one of its bonding pads into two separate pads, electrically isolated form one another. An electrical test confirming power to the memory device confirms the proper mechanical and electrical connection of the capacitor terminal to its pair of bonding pad parts. This technique is not capable of determining the proper orientation of a device such as a polarized capacitor and cannot therefore provide protection against the hazards posed by the improper placement of such a device.

An improved technique which provides such protection in a cost-effective manner is therefore required.

Accordingly, the present invention provides an arrangement for surface mounting an electrical component on a circuit board, the arrangement being testable electrically to indicate both the proper mechanical mounting and the correct orientation of the component on the circuit card, the arrangement comprising: an electrical component including first and second power connector leads, and further including a test connector lead; a circuit board including a connector footprint having first and second pads connected to supply rails on the board and also a pair of test pads connected to first and second test points on the card; wherein when the component is properly connected and oriented with respect to the connector footprint, the test lead is connected to a first of the test pads and one of the first or second power leads bridges between the second test pad and one of the pair of pads connected to the supply rails; and wherein improper connection and orientation of the component is indicated when said one of said first or second power leads bridges between the first of the test pads and the other of the pair of pads connected to the supply rails.

In a preferred arrangement, the component is a polarized capacitor, in particular a tantalum capacitor.

The arrangement according to the invention allows for automatic checking of the presence and orientation of the device at the test operation and does not require visual inspection—either manual or automated. The present invention also avoids the need to use expensive fused capacitors.

A preferred embodiment of the invention will be described by way of example only with reference to the accompanying drawings.

PURPOSES AND SUMMARY OF THE INVENTION

The invention is a novel method and an apparatus for surface mounting polarized electrical components on a printed circuit board.

Therefore, one purpose of this invention is to provide surface mounting of polarized electrical components on a printed circuit board.

Another purpose of this invention is to provide for surface mounting of polarized capacitors, e.g., diode or electrolytic or tantalum capacitors, etc..

Still another purpose of this invention is to have the polarized electronic components be mounted onto electronic circuit board or board assemblies.

Yet another purpose of this invention is the ease of testing of a polarized capacitor.

Still, yet another purpose of this invention is the in place verification of a polarized capacitor.

Yet another purpose of this invention is the electrical testability to indicate both proper mechanical mounting and correct orientation of an electronic component on a printed circuit board.

Therefore, in one aspect this invention comprises a surface mount electronic component for mounting on a printed circuit board, said component being testable electrically when mounted to indicate both proper mechanical mounting and correct orientation of said electronic component on said printed circuit board, comprising:

said electronic component having first and second power connector leads and further having a third test connector lead, said printed circuit board having a connector footprint having first and second pads connected to supply rails on said printed circuit board, said printed circuit board further having a pair of test pads connected to first and second test points on said printed circuit board, wherein when said electronic component is properly mechanically connected and oriented with respect to said connector footprint, said first test lead is electrically connected to said first test pad, and one of said first or said second power leads forms a bridge between said second test pad and one of said pair of pads connected to said supply rails.

In another aspect, this invention comprises a method for testing the presence and orientation of a surface mounted electronic device on a printed circuit board, said electronic device having a first and a second power connector leads for connecting via first and second pads to supply rails on said printed circuit board, said electronic device further having a test connector lead, connector footprint on said printed circuit board further includes a pair of test pads connected to first and second test points on said printed circuit board; said method comprising:

testing at said first and said second test points, whereby electrical connection and correct orientation of said electronic device is sensed when said test lead is connected to said first test pad and wherein one of said first or second power leads bridges between said second test pad and one of said pair of pads connected to said supply rails.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

FIG. 3A, is a perspective view, illustrating a preferred embodiment of the present invention, showing a polarized capacitor which is correctly oriented with respect to a split bonding pad footprint.

FIG. 3B, is an electric circuit diagram of the preferred embodiment showing the correct orientation of a polarized capacitor, as shown in FIG. 3A.

FIG. 4A, is a perspective view, illustrating a polarized capacitor which has been incorrectly oriented with respect to the bonding pad footprint on a printed circuit board, using the preferred embodiment of the present invention.

FIG. 4B, is an electric circuit diagram of an incorrectly oriented polarized capacitor, as shown in FIG. 4A.

DETAILED DESCRIPTION OF THE INVENTION

The following will describe an apparatus and a method for detecting the correct placement and orientation of a surface mounted electronic device or component, such as, a capacitor, for example, a tantalum capacitor, on a printed circuit board. For the ease of understanding electronic component, electronic devices, diodes, various types of capacitors, etc., will be interchangeably used, however, the use of a specific component is not to be used to limit the claimable embodiments of this invention. Furthermore, it should be noted that the method and structure of this invention is applicable to any polarized capacitor or indeed to any other surface mounted electrical or electronic component (e.g. diode) which, in order to function correctly, requires a particular orientation with respect to the bonding pads on a printed circuit board.

Figure 1:
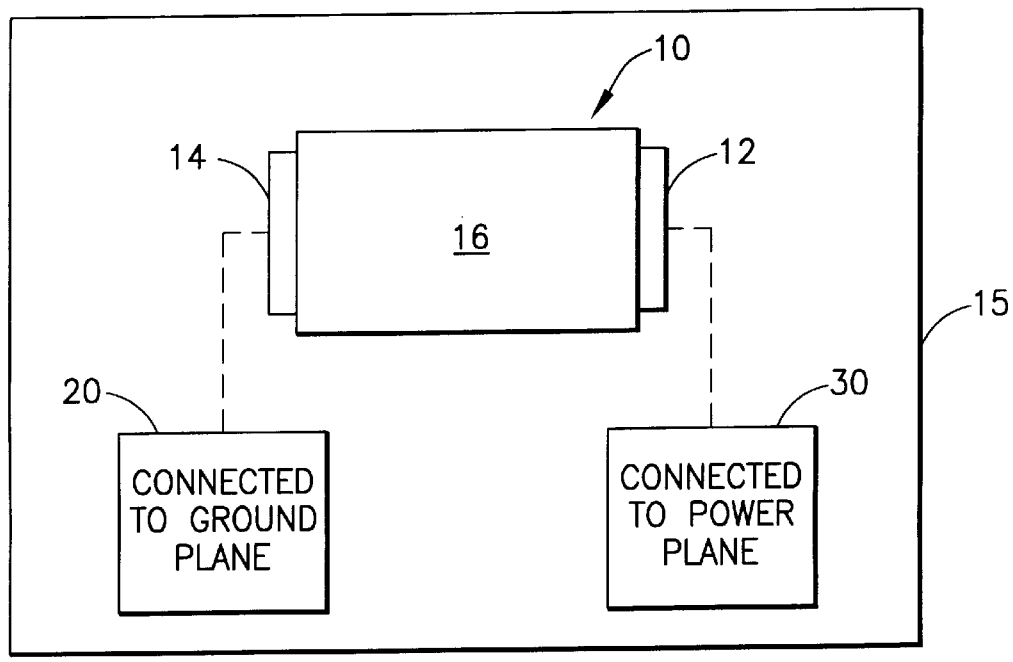
FIG. 1, illustrates the connector configuration of a conventional electrical component and circuit board footprint.

Referring first to FIG. 1, which illustrates in schematic form, the connector configuration of a conventional electrical component and printed circuit board footprint, there is shown a schematic representation of the conventional or prior art footprint for a surface mounted tantalum capacitor 10, on a card or board 15, such as a printed circuit board 15. The capacitor 10, basically consists of a jacket or molding 16, with a power or positive lead 12, and ground or negative lead 14, disposed at either end of the molding 16.

The standard footprint to which the capacitor 10, is connected consists of two pads, namely, pad 20, and pad 30. The pads 20 and 30, are positioned such that the leads 12 and 14, of the capacitor 10, are within their boundary. Each pad is connected to the appropriate voltage plane (supply rail) on the printed circuit card 15.

With this known method of attaching capacitors 10, on pads 20 and 30, of the printed circuit card 15, it is difficult to electrically detect, either the orientation, or the presence of the capacitor 10.

Figure 2:
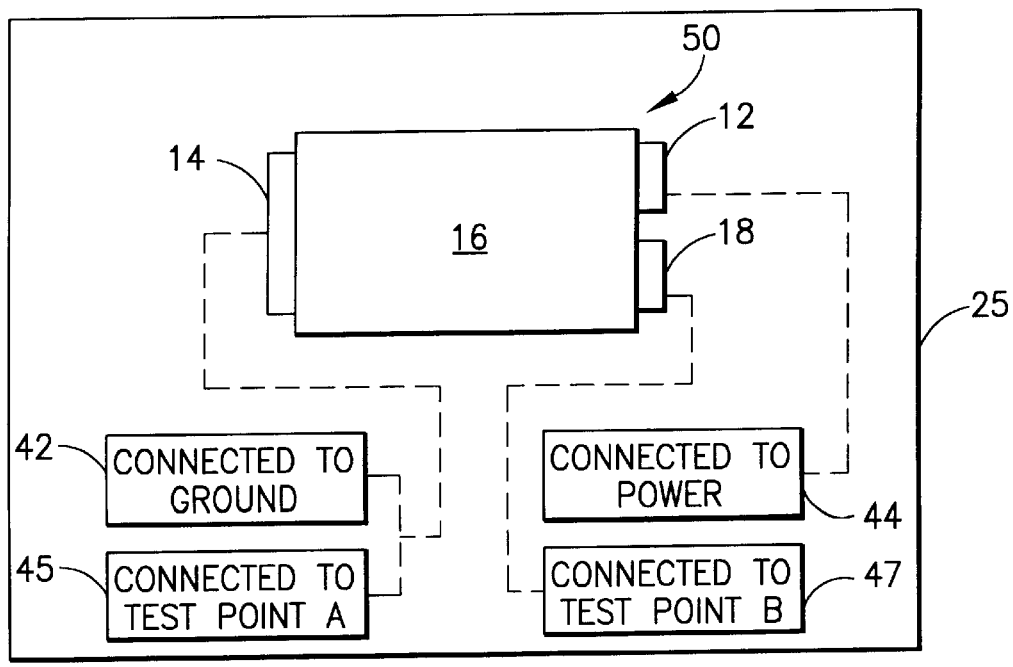
FIG. 2, illustrates a component and footprint configuration according to a preferred embodiment of the present invention.

Turning now to FIG. 2, which illustrates a component and footprint configuration according to a preferred embodiment of the present invention, there is shown an electronic component or device 50, such as, a capacitor 50, having three leads, on a printed circuit card or board 25. The footprint configuration of the electronic device 50, enables testing for both the presence and the orientation of the electronic device 50, such as, a capacitor 50.

As can be clearly seen that the footprint of the printed circuit board 25, in FIG. 2, differs from the footprint of the printed circuit board 15, of FIG. 1, in that each pad 20 and 30, of FIG. 1, is effectively split into two electrically isolated pads thereby forming four pads, namely, pads 42, 44, 45 and 47.

Furthermore, the capacitor 50, such as, a tantalum capacitor 50, itself differs from the conventional capacitor 10, shown in FIG. 1, by the presence of a third lead 18. This third lead 18, is unconnected to the capacitive function inside the molding 16. The third lead 18, is primarily employed in the method of the present invention to determine the orientation of the capacitor 50. The third lead 18, also acts to increase the mechanical strength of the solder joints.

As stated earlier, the printed circuit board 25, of FIG. 2, now has four pads, namely pads 42, 44, 45 and 47. Two of these pads 42, 44 are connected to the circuit voltages as normal, but the other two pads 45, 47 are connected to test points A and B, respectively.

The method of testing the presence and the rotation using the capacitor/footprint configuration of FIG. 2, will now be explained with reference to the perspective views of FIGS. 3A and 4A, in conjunction with electric circuit diagrams 3B and 4B, respectively.

FIG. 3A, which is a perspective view, illustrates a preferred embodiment of the present invention, showing a three leaded electronic device 50, such as, a polarized capacitor 50, which is correctly oriented with respect to a split bonding pad footprint.

The three leaded capacitor 50, of FIG. 3A, is shown correctly oriented with respect to the split pads 42, 44, 45, and 47. When placed correctly, the power lead 12, is connected to the power plane or VCC 43, via pad 44, and unconnected lead 18, is connected to test point B 48, via pad 47.

The ground or negative lead 14, forms a bridge or short between the ground plane 41, at pad 42, and test point A 46, at pad 45, via pads 42 and 45. Thus testing of the circuit at test point A 46, and test point B 48, will indicate that test point A 46, is at ground or short, and test point B 48, is unconnected or open. These test results verify to the testing apparatus that the capacitor 50, is present and that it is correctly oriented, and that the polarity of the capacitor is not reversed, which can also be clearly seen using the circuit diagram depicted in FIG. 3B.

FIG. 4A, is a perspective view, illustrating a polarized capacitor which has been incorrectly oriented with respect to the bonding pad footprint on a printed circuit board 25, using the preferred embodiment of the present invention. As can be clearly seen in FIGS. 4A and 4B, that the electronic device 50, such as, a tantalum capacitor 50, is shown in an incorrect orientation. The power lead 12, is connected to test point A 46, via pad 45, (and hence is isolated from either power or ground) and the unconnected lead 18, is connected to ground 41, via pad 42. The ground or negative lead 14, bridges the power plane or VCC 43, at pad 44, to test point B 48, at pad 47, via pads 44 and 47, which can also be clearly seen in the circuit diagram depicted in FIG. 4B.

Thus during testing of the printed circuit board 25, test point A 46, is connected through the capacitor 50, to the power plane 43, thereby resulting in a different reading from the capacitor orientation of FIG. 3A. The reading will depend on the actual capacitor in the circuit.

Test point B 48, at pad 47, is connected to the power plane 43, at pad 44, via lead 14. These test results indicate to the tester that the capacitor 50, is in place but that it is incorrectly oriented. Rework of the printed circuit board 25, may then be undertaken.

It should also be noted that as power or positive lead 12, is isolated from both power and ground, so the capacitor 50, is effectively isolated from the printed circuit card 25, and therefore does not present a safety hazard nor is the capacitor 50, inadvertently destroyed. This feature is advantageous in the situation described above where repairs can be carried out without subsequent testing.

It should also be appreciated that other lead/pad configurations will also give the ability to determine when the capacitor 50, is correctly oriented. For instance, the configuration of FIG. 2, could be changed by reversing the positions of leads 12 and 18. Such a reversal would require swapping the positions of pads 42 and 45, and also of pads 44 and 47, in order to ensure that the capacitor 50, is isolated from the circuit when in the wrong orientation.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A surface mount electronic component for mounting on a printed circuit board, said component being testable electrically when mounted to indicate both proper mechanical mounting and correct orientation of said electronic component on said printed circuit board, comprising:

said electronic component having first and second power connector leads and further having a test connector lead, said printed circuit board having a connector footprint having first and second pads connected to supply rails on said printed circuit board, said printed circuit board further having first and second test pads connected to first and second test points on said printed circuit board, wherein when said electronic component is properly connected and oriented with respect to said connector footprint, said first lead is electrically connected to said first pad, and one of said first or said second power leads forms a bridge between said second test pad and one of said pads connected to said supply rails.

2. The surface mount electronic component of claim 1, wherein said electronic component is selected from a group consisting of diode, capacitor, electrolytic capacitor and polarized capacitor.

3. The surface mount electronic component of claim 2, wherein said polarized capacitor is a tantalum capacitor.

4. The surface mount electronic component of claim 1, wherein improper connection and orientation of said component is indicated when one of said first or said second power leads forms a bridge between said first test pad and the other of the pair of pads connected to said supply rails.

5. The surface mount electronic component of claim 1, wherein said printed circuit board is selected from a group consisting of single layered and multi-layered printed circuit board.

6. A method for testing the presence and orientation of a surface mounted electronic device on a printed circuit board, said electronic device having a first and a second power connector leads for connecting via first and second pads to supply rails on said printed circuit board, said electronic device further having a test connector lead, connector footprint on said printed circuit board further includes a pair of test pads connected to first and second test points on said printed circuit board; said method comprising:

testing at said first and said second test points, whereby electrical connection and correct orientation of said electronic device is sensed when said test lead is connected to said first test pad and wherein one of said first or second power leads bridges between said second test pad and one of said pair of pads connected to said supply rails.

7. The method of claim 6, wherein said electronic component is selected from a group consisting of diode, capacitor, electrolytic capacitor and polarized capacitor.

8. The method of claim 7, wherein said polarized capacitor is a tantalum capacitor.

9. The method of claim 6, wherein improper connection and orientation of said component is indicated when one of said first or said second power leads forms a bridge between said first test pad and the other of the pair of pads connected to said supply rails.

10. The method of claim 6, wherein said printed circuit board is selected from a group consisting of single layered and multi-layered printed circuit board.

\* \* \* \* \*